(12) United States Patent
Formosa et al.

(10) Patent No.: US 9,446,943 B2
(45) Date of Patent: Sep. 20, 2016

(54) WAFER-LEVEL PACKAGING OF INTEGRATED DEVICES, AND MANUFACTURING METHOD THEREOF

(71) Applicants: STMicroelectronics S.r.l., Agrate Brianza (IT); STMicroelectronics (Malta) Ltd, Kirkop (MT)

(72) Inventors: Kevin Formosa, Zabbar (MT); Luca Maggi, Garlate (IT)

(73) Assignees: STMicroelectronics S.r.l., Agrate Brianza (IT); STMicroelectronics (Malta) Ltd, Kirkop (MT)

( * ) Notice: Subject to any disclaimer, the term of this patent is extended or adjusted under 35 U.S.C. 154(b) by 11 days.

(21) Appl. No.: 14/288,130

(22) Filed: May 27, 2014

(65) Prior Publication Data
US 2014/0353775 A1  Dec. 4, 2014

(30) Foreign Application Priority Data
May 31, 2013  (IT) .............................. TO2013A0446

(51) Int. Cl.
*H01L 29/84* (2006.01)
*B81B 7/00* (2006.01)
(Continued)

(52) U.S. Cl.
CPC ............. *B81B 7/007* (2013.01); *B81B 3/0094* (2013.01); *B81C 1/00238* (2013.01); *B81C 1/00301* (2013.01); *H01L 24/94* (2013.01); *H01L 24/97* (2013.01); *H01L 25/0657* (2013.01); *H01L 25/50* (2013.01); *H01L 29/84* (2013.01); *B81B 2207/012* (2013.01); *B81B 2207/07* (2013.01); *B81B 2207/095* (2013.01); *B81B 2207/097* (2013.01); *B81C 2203/00* (2013.01);
(Continued)

(58) Field of Classification Search
CPC ... H01L 29/94; H01L 25/0657; H01L 29/84; B81B 7/007; B81C 1/00238; B81C 1/00301
See application file for complete search history.

(56) References Cited

U.S. PATENT DOCUMENTS 6,613,606 B1  9/2003  Lee
7,335,986 B1  2/2008  Paek et al.
(Continued)

FOREIGN PATENT DOCUMENTS

EP    1 455 392 A1   8/2004
WO    2014/121090 A1  7/2014

*Primary Examiner* — Michele Fan
(74) *Attorney, Agent, or Firm* — Seed IP Law Group PLLC

(57) ABSTRACT

A wafer-level packaging, comprising: a first semiconductor body integrating a MEMS structure; a second semiconductor body, including a surface electrical-contact region and an ASIC coupled to the MEMS structure and to said electrical-contact region; a first coating layer, made of resin, which englobes and protects the first body, the second body, and the electrical-contact region; at least one first conductive through via, which extends through the first coating layer in an area corresponding, and electrically coupled, to the first electrical-contact region; an electrical-contact pad, which extends over the first coating layer, electrically coupled to the first conductive through via; a third semiconductor body, integrating an electronic circuit, glued on the first coating layer; a second coating layer, made of resin, which englobes and protects the third body; at least one second conductive through via, which extends completely through the second coating layer in an area corresponding, and electrically coupled, to the electrical-contact pad; and a further electrical-contact pad electrically coupled to the second conductive through via.

15 Claims, 10 Drawing Sheets

(51) Int. Cl.
*H01L 25/065* (2006.01)
*H01L 25/00* (2006.01)
*B81B 3/00* (2006.01)
*B81C 1/00* (2006.01)
*H01L 23/00* (2006.01)
*H01L 23/31* (2006.01)
*H01L 21/56* (2006.01)

(52) U.S. Cl.
CPC ............ *B81C2203/0136* (2013.01); *B81C 2203/0792* (2013.01); *H01L 21/561* (2013.01); *H01L 23/3114* (2013.01); *H01L 24/73* (2013.01); *H01L 2224/16145* (2013.01); *H01L 2224/32145* (2013.01); *H01L 2224/48145* (2013.01); *H01L 2224/73265* (2013.01); *H01L 2224/81005* (2013.01); *H01L 2224/94* (2013.01); *H01L 2224/97* (2013.01); *H01L 2225/06506* (2013.01); *H01L 2225/06513* (2013.01); *H01L 2225/06524* (2013.01); *H01L 2225/06548* (2013.01); *H01L 2924/12042* (2013.01); *H01L 2924/181* (2013.01)

(56) References Cited

U.S. PATENT DOCUMENTS

| | | | |
|---|---|---|---|
| 7,923,790 B1* | 4/2011 | Quevy | B81C 1/00333 257/414 |
| 8,669,143 B2* | 3/2014 | Theuss | B81C 1/00238 438/126 |
| 8,772,152 B2 | 7/2014 | Co et al. | |
| 2006/0148137 A1* | 7/2006 | Hartzell | B81C 1/0023 438/149 |
| 2008/0237883 A1 | 10/2008 | Tago et al. | |
| 2010/0127340 A1* | 5/2010 | Sugizaki | B81B 7/007 257/415 |
| 2013/0001710 A1 | 1/2013 | Daneman et al. | |
| 2013/0040423 A1 | 2/2013 | Tung et al. | |

* cited by examiner

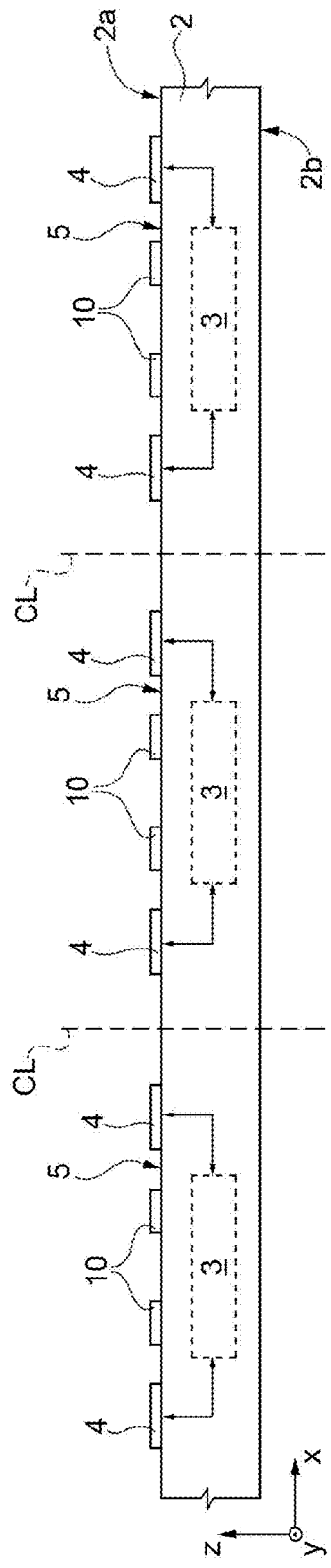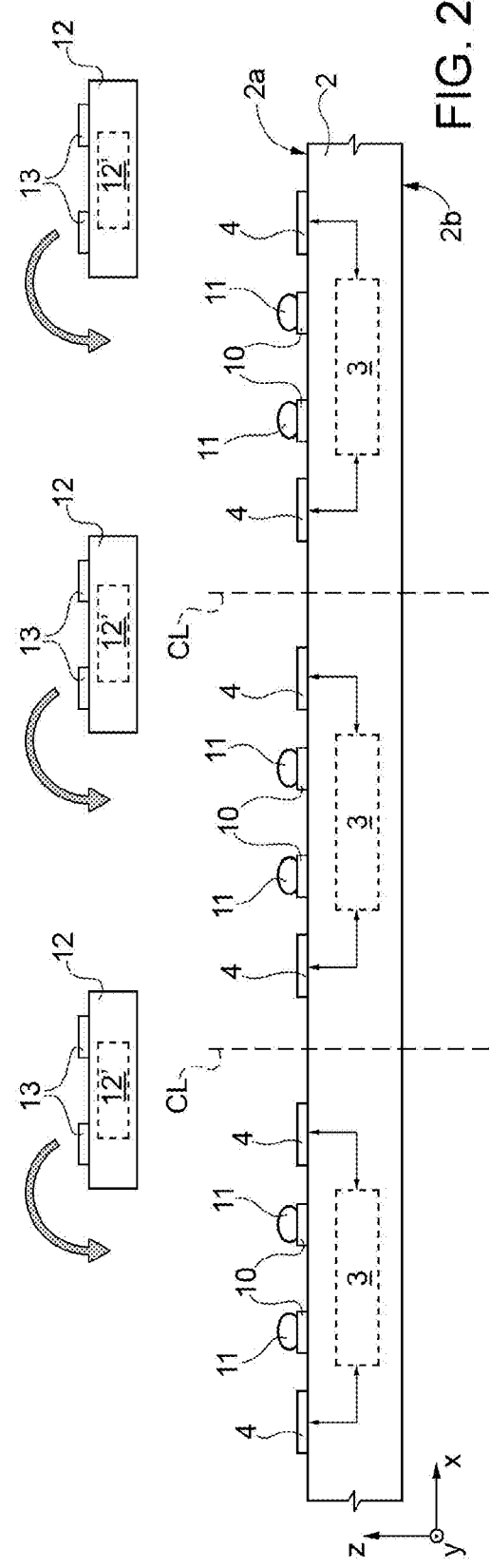

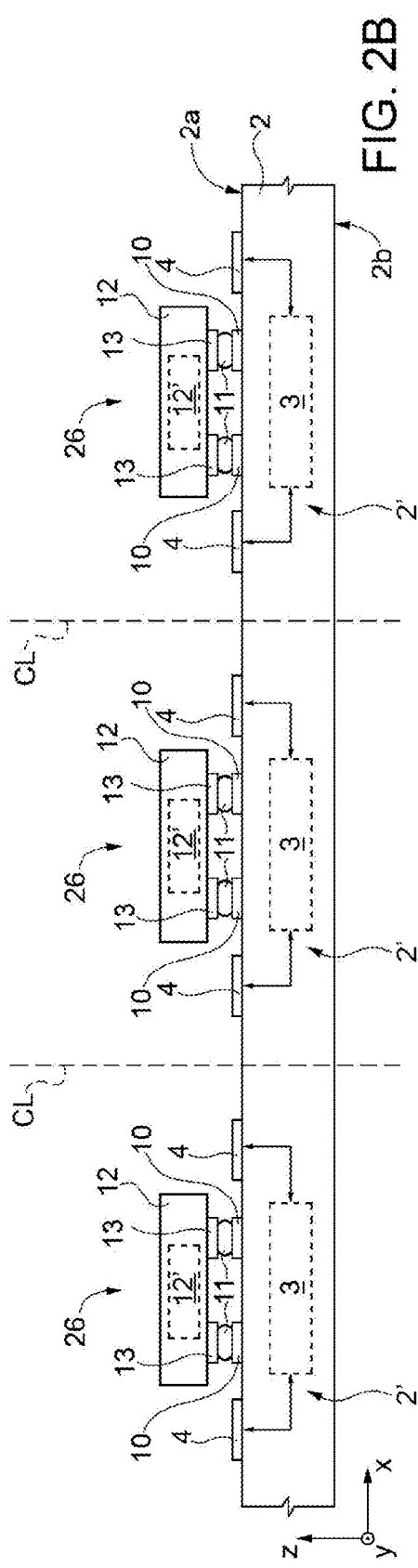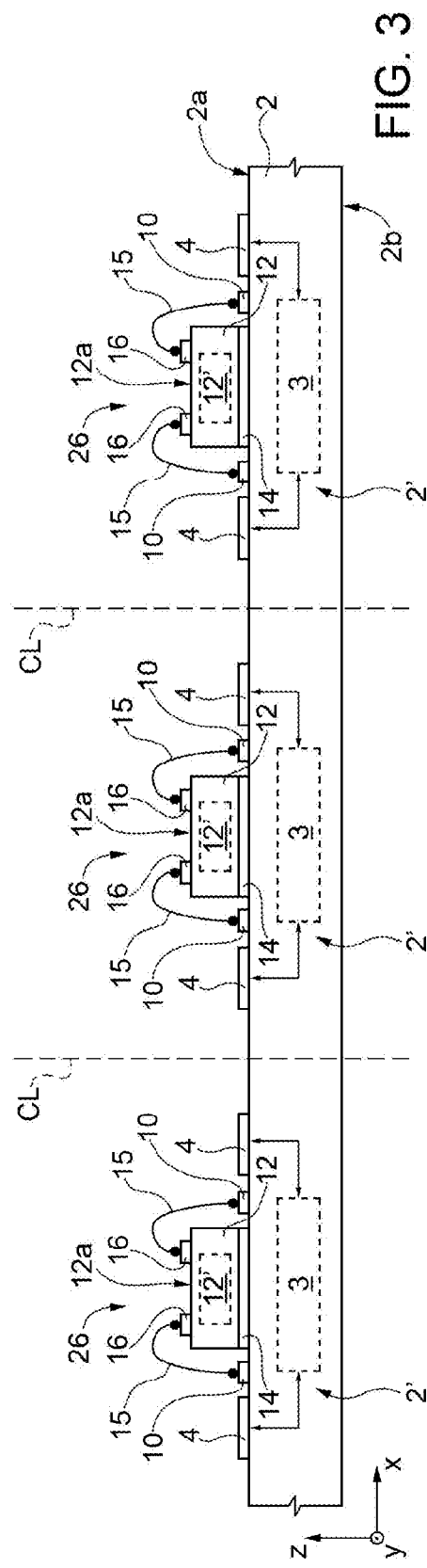

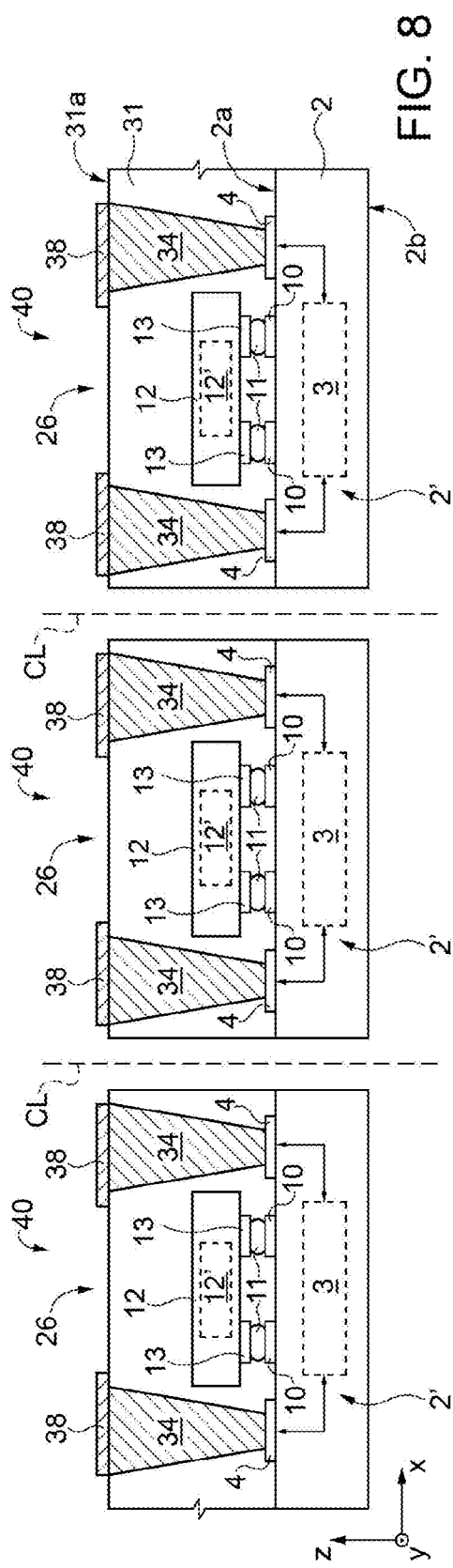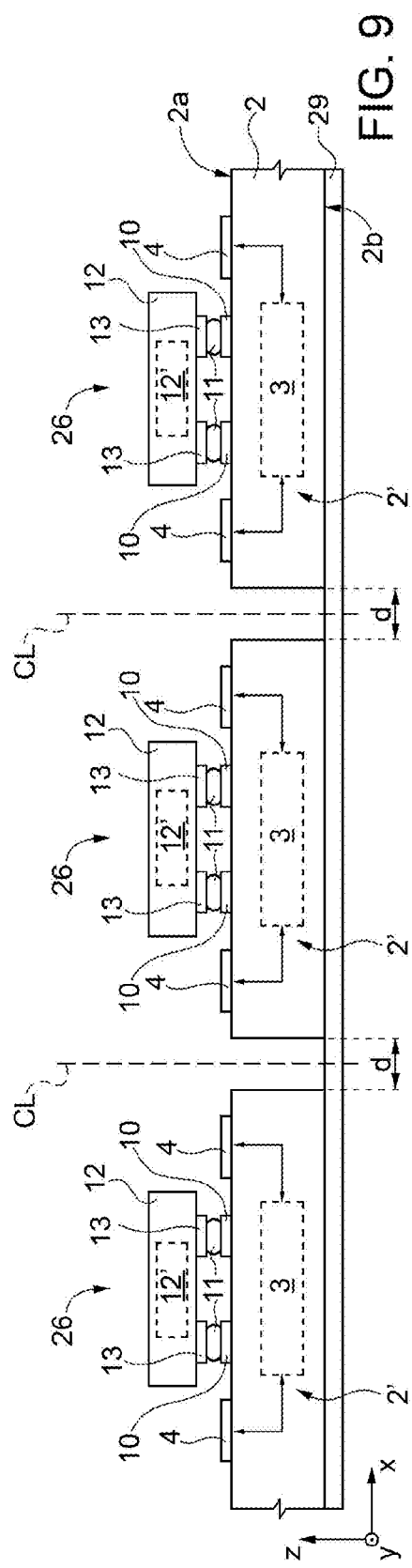

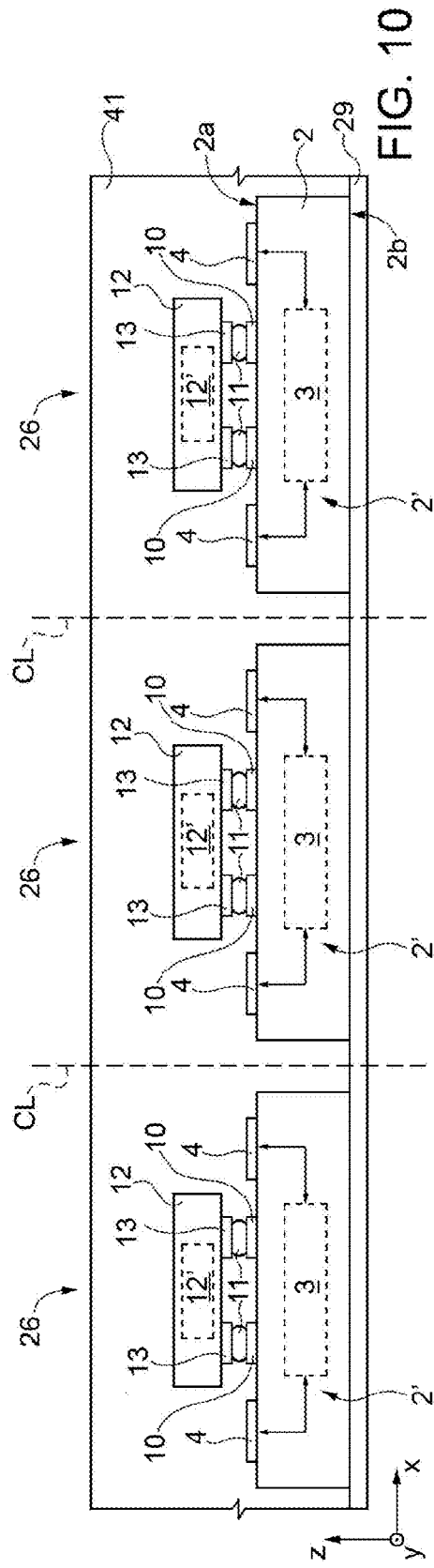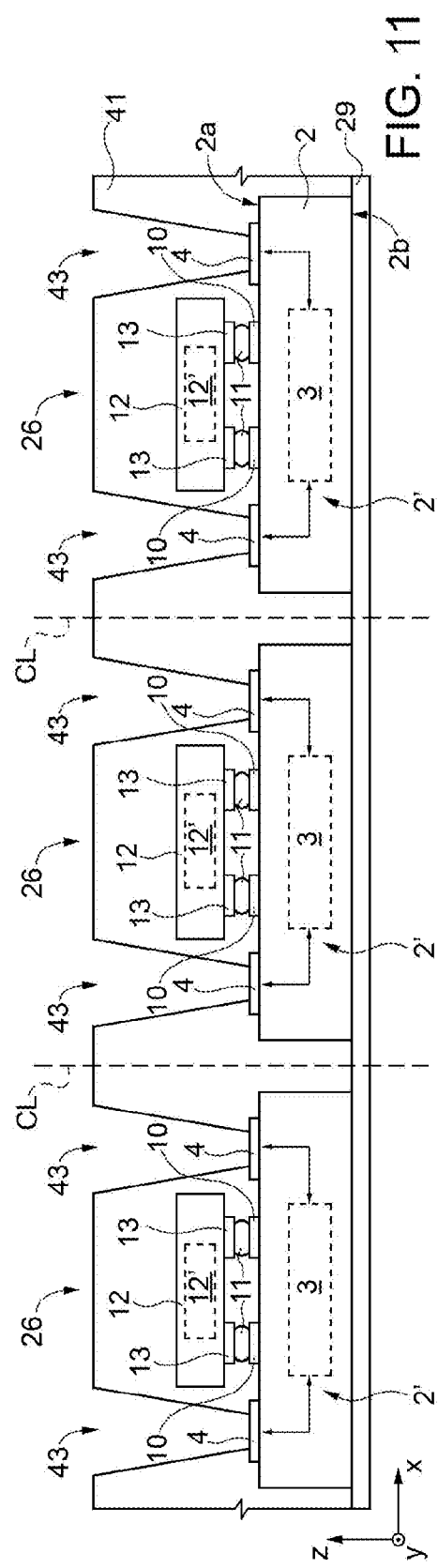

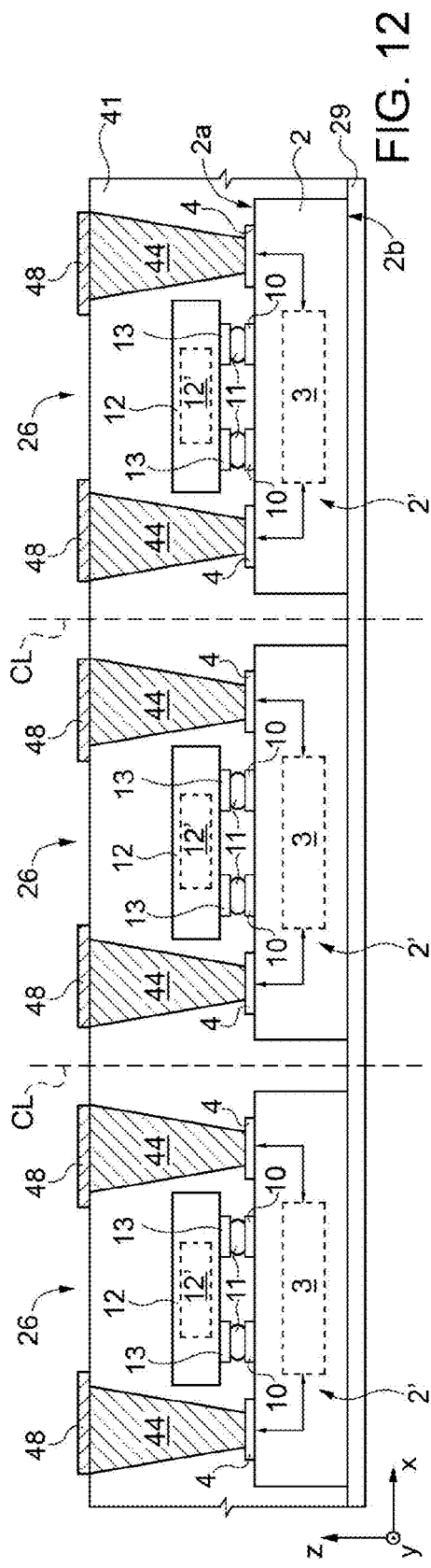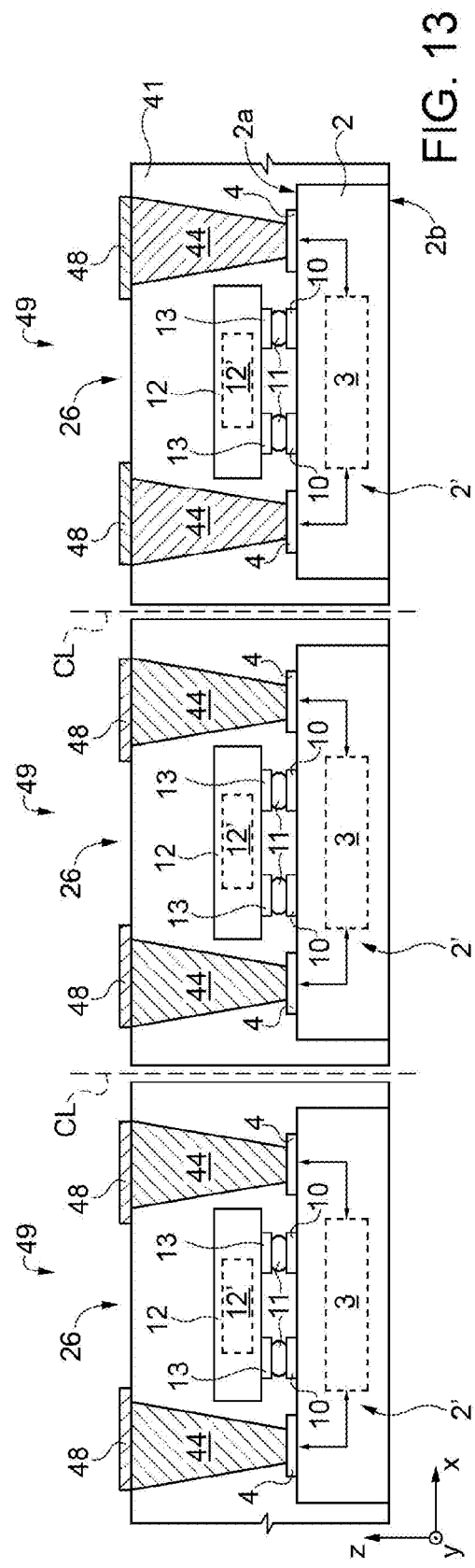

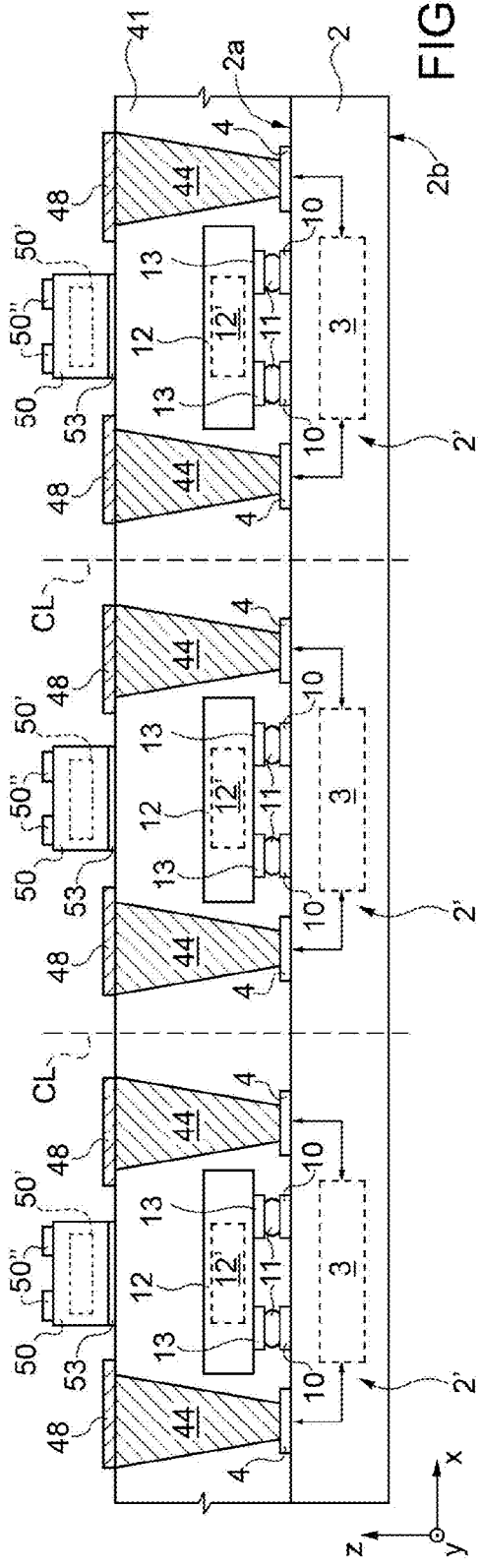
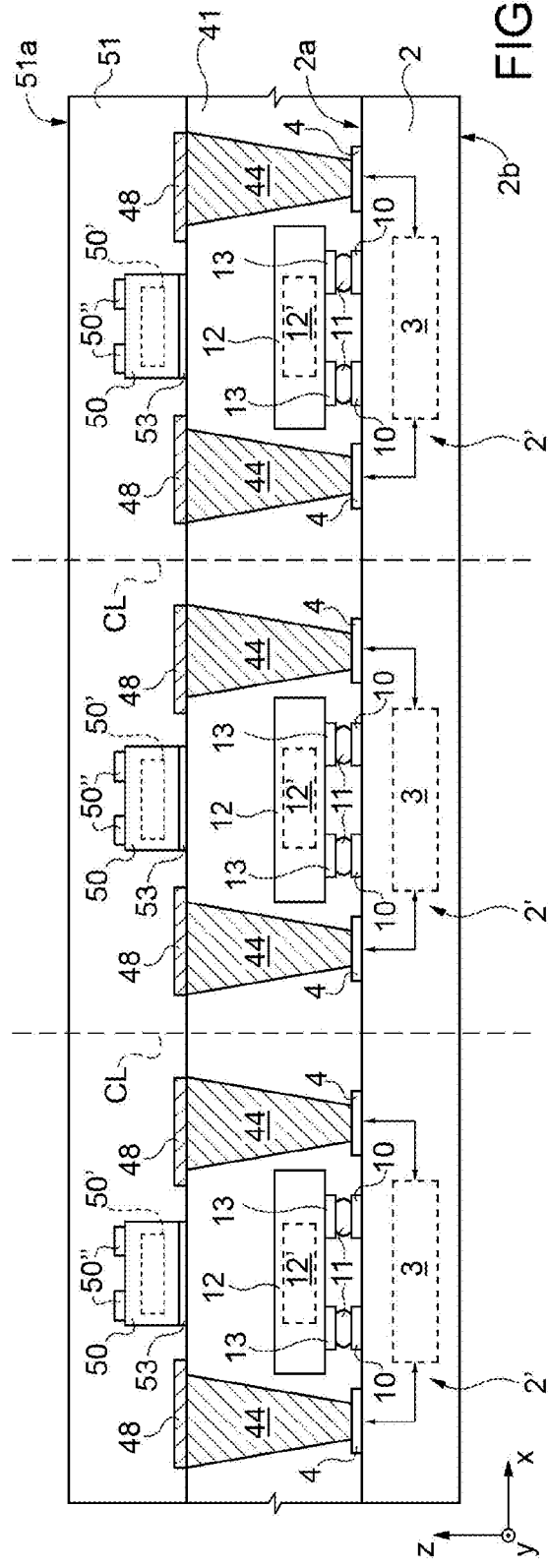
FIG. 14
FIG. 15

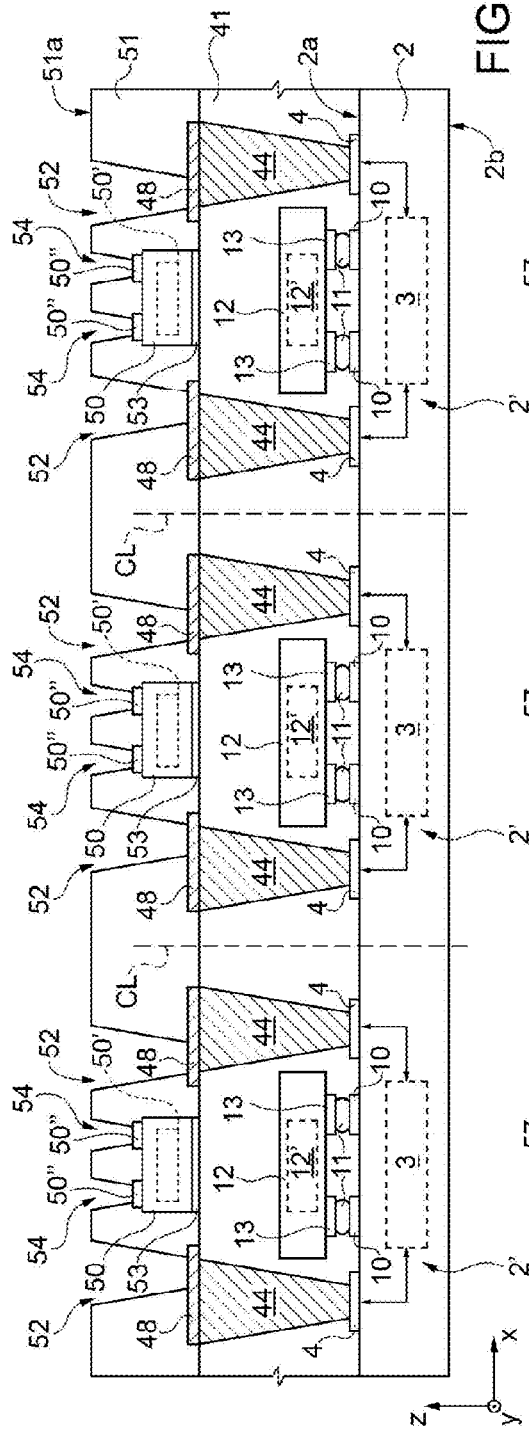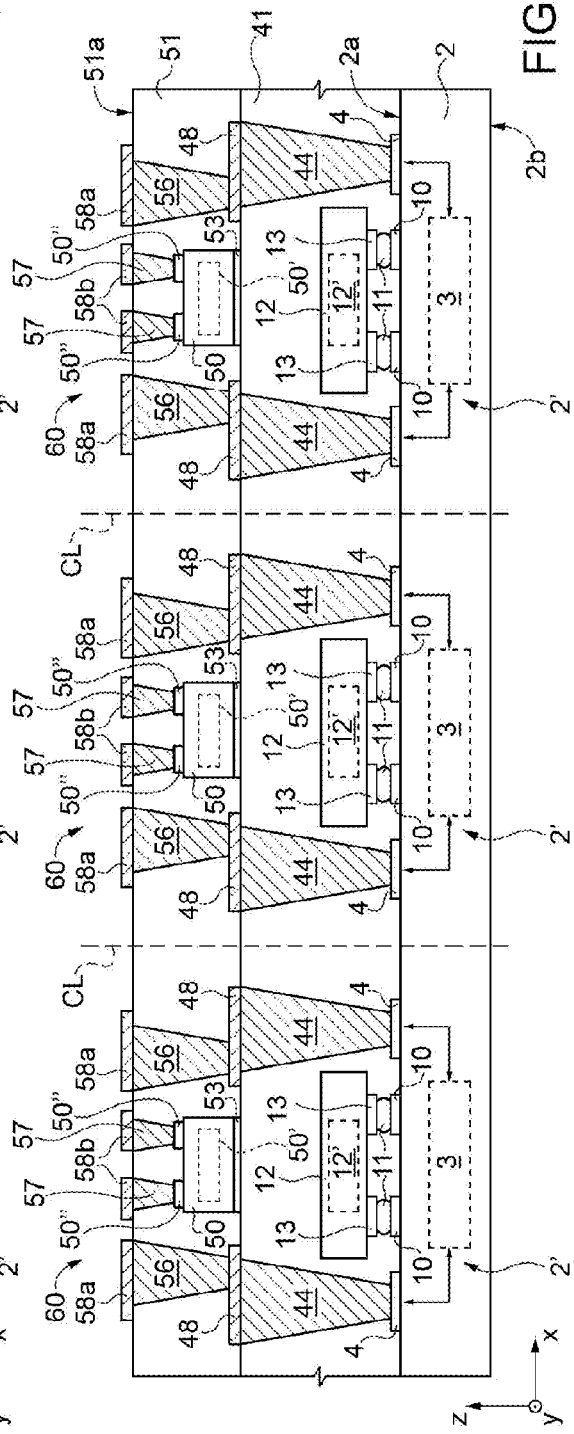

WAFER-LEVEL PACKAGING OF INTEGRATED DEVICES, AND MANUFACTURING METHOD THEREOF

BACKGROUND

1. Technical Field

The present disclosure relates to a wafer-level packaging of a plurality of integrated devices, such as, for example, microelectromechanical devices (MEMS) and/or electronic devices. The present disclosure moreover relates to a method for manufacturing said wafer-level packaging.

2. Detailed Description

Within the field of integrated devices there is a desire to reduce the dimensions in order to meet increasingly stringent specifications of miniaturization, in particular in the field of portable apparatuses, such as, for example, smartphones, tablets, or personal digital assistants (PDAs).

In a known way, a MEMS integrated device generally comprises a first body (usually defined as "die"), which includes semiconductor material (in particular silicon), integrating a micromechanical structure, operating, for example, as a sensor for detecting one or more quantities (for example, for providing an accelerometer, or gyroscope, or magnetometer) and generates an electrical quantity that is a function of the quantity to be detected (for example, a capacitive variation, a variation of electrical resistance, etc.). In an equally known way, the die is the result of an operation of sawing, or singulation, of a wafer, where a plurality of elementary devices are simultaneously produced, during the manufacturing method.

A MEMS integrated device further comprises at least one second die including semiconductor material (in particular silicon), integrating at least one electronic component or circuit, designed to be electrically coupled to the micromechanical structure so as to co-operate functionally therewith. Typically, the second die integrates an ASIC (Application-Specific Integrated Circuit), electrically coupled to the micromechanical structure, which has, for example, the function of a circuit for reading the electrical quantity detected by the micromechanical structure in the case where it operates as sensor (for example, for performing operations of amplification and filtering of the electrical quantity detected). The ASIC may moreover have further functions of processing and evaluation of the quantities detected in order to provide integrated systems known as "SiPs" (Systems in Package).

A MEMS integrated device generally includes a package, i.e., a container or casing that surrounds, totally or in part, the dice of the device itself, ensuring protection thereof from external agents and enabling electrical connection thereof to the external environment. The assembly of the MEMS integrated device within the corresponding package is usually defined as a whole as a "chip", and can, for example, be electrically connected to a printed circuit of an electronic apparatus in which the MEMS integrated device itself is to be used.

In particular, in the case where the micromechanical structure presents deformable elements, for example a beam or a membrane that is to undergo deformation according to the quantity to be detected, the package includes a covering structure, or cap, defining at least one cavity, provided in an area corresponding to said deformable elements, in such a way as to provide an empty space that will ensure freedom of movement thereof and will not alter deformation thereof.

A known package structure, defined as wafer-level package, is particularly advantageous in the case of portable applications in so far as it enables resulting dimensions to be obtained that do not depart significantly from those of the dice that are packaged. In brief, the corresponding packaging technique envisages the use of standard processes of micromanufacture of the dice also for the production of the corresponding package by producing at a wafer level, i.e., prior to the corresponding operation of singulation, also the structures for covering and protection of the dice themselves and the corresponding electrical connections towards the outside world, thus simplifying and rendering uniform the overall manufacturing process.

Electrical connection of the chip, formed as described previously, to a printed circuit of an electronic apparatus in which the MEMS integrated device is to be used is typically obtained by means of solder balls formed on the back of the second die (i.e., on the surface of the second die that is opposite to the one to which the first die is coupled). The solder balls are electrically coupled to conductive pads, which extend in the aforementioned cavity through conductive through holes, which extend throughout the thickness of the second die. In turn, the conductive pads are electrically coupled to respective conductive pads present on the first die so as to be able to acquire electrical signals generated, in use, by the micromechanical structure and/or to control said micromechanical structure.

In the case of micromechanical structures with a membrane or the like (i.e., structures including further or different deformable elements), the necessary presence of a cavity means that a desired reduction of the resulting dimensions of the package is, however, difficult to obtain on account, for example, of the requisites of thickness of the walls of the cavity (which is frequently made of a composite substrate of the BT—bismaleimide triazine—type, having the function of covering structure). Moreover, a marked reduction of the dimensions involves a greater difficulty in the steps of processing of the covering structure that closes the cavity at the top, and bigger problems linked to mismatches in the coefficients of thermal expansion of the materials used.

In general, there consequently arise problems of reliability and stability of performance, as the dimensions of the package decrease, which can jeopardize the usability of the resulting integrated devices.

There is hence felt the desire in the sector to improve and simplify further the techniques of packaging of MEMS integrated devices, in particular for the purposes of containing the dimensions.

BRIEF SUMMARY

According to one or more embodiments of the present disclosure there is provided a wafer-level packaging of one or more integrated devices and a corresponding manufacturing method. For instance, one embodiment is directed to a package comprising a first semiconductor body integrating a first microelectromechanical structure and a second semiconductor body having a first side. The second semiconductor body includes an active region integrating an electronic circuit that is coupled to the first microelectromechanical structure and a first electrical-contact region operatively coupled to said electronic circuit. The package further includes a first coating layer of resin located over the first semiconductor body and the second semiconductor body. The first coating layer has a first surface. A first conductive through via extends through the first coating layer and electrically is coupled to the first electrical-contact region. The package further includes a second electrical-contact region located on the first surface of the first coating layer and electrically coupled to the first conductive through via.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 1-8 show steps of processing of an ASIC wafer in order to form a plurality of chips including packaged structures, according to one embodiment of the present disclosure;

FIGS. 9-13 show steps of processing of an ASIC wafer in order to form a plurality of chips including packaged structures according to a further embodiment of the present disclosure;

FIGS. 14-18 show further processing steps that can be carried out after the step of FIG. 7 or the step of FIG. 12 so as to form a plurality of chips including packaged structures according to a further embodiment of the present disclosure.

DETAILED DESCRIPTION

Figure 4:
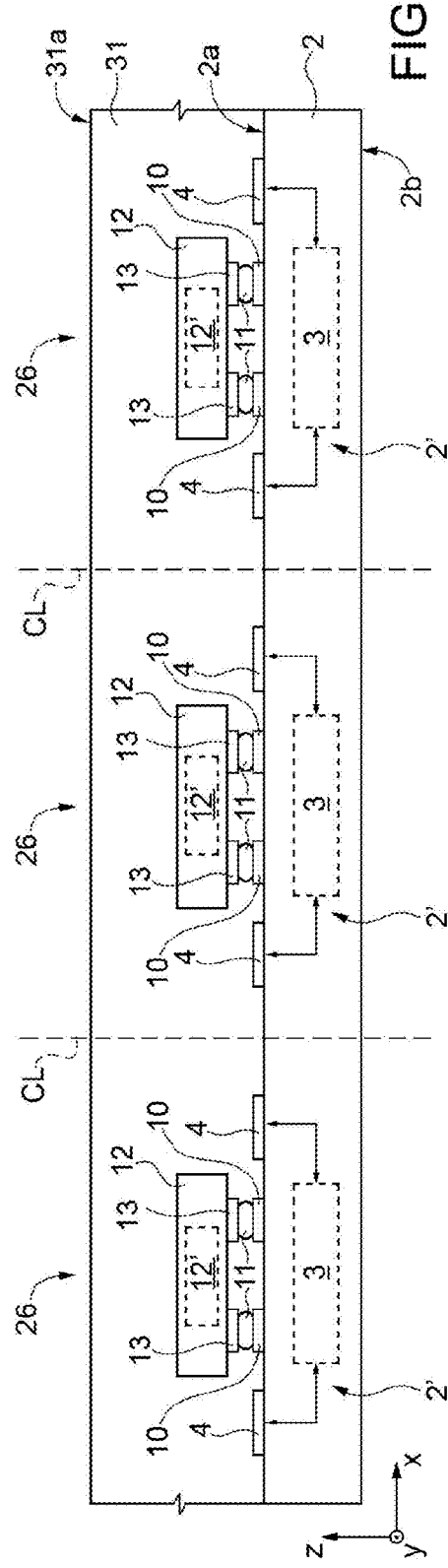

With reference to FIG. 1, an initial step of the manufacturing process envisages provision of an ASIC wafer 2 including semiconductor material, such as silicon, integrating a plurality of electronic circuits ASICs 3. Each ASIC 3 is illustrated schematically and includes, in a way in itself known, a plurality of active and/or passive electronic components, such as transistors, capacitors, inductors, resistors, amplifiers, etc., obtained with known semiconductor-micromachining techniques.

The ASICs 3 are formed in respective regions of the ASIC wafer 2, which, following upon successive steps of cutting along scribe lines CL, form dies or chips, operating independently of one another.

The ASIC wafer 2 has a front surface 2a and a plurality of active regions 5 at the front surface 2a, where the respective ASICs 3 are formed. The ASIC wafer 2 moreover has a rear surface 2b, opposite to the front surface 2a along a vertical direction z (i.e., along the thickness of the ASIC wafer 2). The vertical direction z is orthogonal to a horizontal plane xy of principal extension of said ASIC wafer 2, defined by a first horizontal axis x and by a second horizontal axis y. The horizontal plane xy is likewise parallel to the planes of the front surface 2a and of the rear surface 2b of the ASIC wafer 2.

According to one embodiment of the present disclosure, the ASIC wafer 2 has, on the front surface 2a, top metal regions (also referred to as "top metal layers") that form electrical contacts or conductive pads 4. The conductive pads 4 form input/output interfaces to/from each respective ASIC 3, and likewise have the function of providing an interface between each respective ASIC 3 and the outside of the ASIC wafer 2, as illustrated more clearly hereinafter. The conductive pads 4 are electrically insulated from one another (in a way not illustrated in detail, but in itself known, for example by providing dielectric regions, which extend between one conductive pad 4 and another).

Moreover, there may be formed, on the front surface 2a of the ASIC wafer 2, further electrical paths, electric-bonding tracks or pads. For instance, contact pads 10 are formed, which extend over the front surface 2a of the ASIC wafer 2 at a distance from the conductive pads 4 and electrically insulated from one another. In particular, the contact pads 10 extend in regions of the front surface 2a of the ASIC wafer 2 delimited, in top plan view (i.e., in the plane xy), by the conductive pads 4.

Moreover, in a way in itself known and not illustrated in the figure, it is possible to provide a redistribution or routing layer (the so-called RdL—"redistribution layer") on the front surface 2a of the ASIC wafer 2. The redistribution layer is defined (for example, lithographically) to form electrical paths and contacts such as to redistribute and route the electrical signals coming from a respective ASIC 3 to respective conductive pads 4 and contact pads 10, and/or vice versa. The electrical-connection paths in the redistribution layer are electrically insulated from one another, for example by regions of insulating material.

As shown in FIG. 2A, a plurality of MEMS dice 12 are provided, configured for being coupled, by means of the flip-chip technique, to the ASIC wafer 2. With reference to FIGS. 2A and 2B, the coupling between each MEMS die 12 and the ASIC wafer 2 is obtained using solder balls 11, which enable mechanical and electrical coupling between the MEMS dice 12 and the ASIC wafer 2 at the same time. In particular, formation of the solder balls 11, and hence coupling between each MEMS die 12 and the ASIC wafer 2, is obtained at the contact pads 10.

Each MEMS die 12 integrates a micromechanical structure 12' (illustrated schematically), which may indifferently be of any type. For instance, the micromechanical structure 12' includes mobile and fixed portions of an inertial sensor, or else a membrane or some other deformable mechanical element, etc.

Each MEMS die 12 has a front surface 12a, in an area corresponding to which is provided the micromechanical structure 12', and a rear surface 12b, which has respective contact pads 13 that function as electrical and mechanical coupling interface with the solder balls 11 and enable passage of electrical control signals from the respective ASIC 3 to the micromechanical structure 12', and passage of electrical detection signals from the micromechanical structure 12' to the ASIC 3.

According to an alternative embodiment, illustrated in FIG. 3, the MEMS die 12 is coupled to the ASIC wafer 2 by means of an adhesive layer 14. According to this embodiment, the electrical contacts between the MEMS structure 12' in the MEMS die 12 and the ASIC 3 in the ASIC wafer 2 are provided by means of electrical wires 15 with the so-called "wire bonding" technique. In particular, the electrical wires 15 connect electrical pads 16 housed on the front surface 12a of the MEMS die 12 to corresponding contact pads 10, which extend on the front surface 2a of the ASIC wafer 2. The adhesive layer 14 is, for example, a biadhesive tape, or else a layer of glue, such as an epoxy glue.

At the end of the steps of FIGS. 2B and 3, according to the respective embodiments, an ASIC wafer 2 is thus obtained, that houses a plurality of elementary assemblies 26, ideally separated from one another at the scribe lines CL of the ASIC wafer 2. Each elementary assembly 26 includes a respective portion 2' of the ASIC wafer 2 housing an ASIC 3, respective contact pads 10, respective electrical-connection elements (the solder balls 11 or the conductive wires 15), a respective MEMS die 12 electrically coupled to the contact pads 10, and respective conductive pads 4 to enable electrical coupling with the respective ASIC 3.

FIGS. 2B and 3 are mutually alternative embodiments and are cross-sectional views exemplifying the presence of said elementary assemblies 26, which repeat in the horizontal plane xy. In particular, in top plan view, the elementary assemblies 26 repeat over the entire ASIC wafer 2, both in the direction x and in the direction y, separated from one another in at the scribe lines CL.

The subsequent FIGS. 4-8 refer to manufacturing steps that immediately follow the step illustrated in FIG. 2B. However, it is clear that what has been described herein applies in a similar way, as will be evident to the person skilled in the branch, also to the embodiment of FIG. 3.

With reference to FIG. 4, a molding operation is carried out to form a coating 31, known as "mold compound". The coating 31 is, for example, made of resin, such as for example epoxy resin, without halogens (e.g., Bakelite G770), and surrounds (at least partially) each elementary assembly 26 laterally and at the top. The coating 31 has a function of mechanical protection and electrical insulation of each elementary assembly 26 from external agents. The coating 31 extends over the entire front surface 2a of the ASIC wafer 2, protecting it.

A front surface 31a of the coating 31 is exposed at the top. Since the elementary assemblies 26 are embedded in the resin that forms the coating 31, they also are protected from external agents by means of the coating 31. The coating 31 hence has a thickness, in the direction z, chosen according to the specifications, and may cover the MEMS dice 12 completely.

According to one embodiment of the present disclosure, the steps of formation of the coating 31 comprise inserting the wafer in an appropriately shaped molding chamber, and injecting the molding resin in the molding chamber at high pressure. The injection is made through nozzles. The pressure is such as to allow the resin to flow, filling all the interstices present between the chips. Finally, the resin is polymerized with a thermal treatment at the polymerization temperature that is specific for the resin used.

Figure 5:
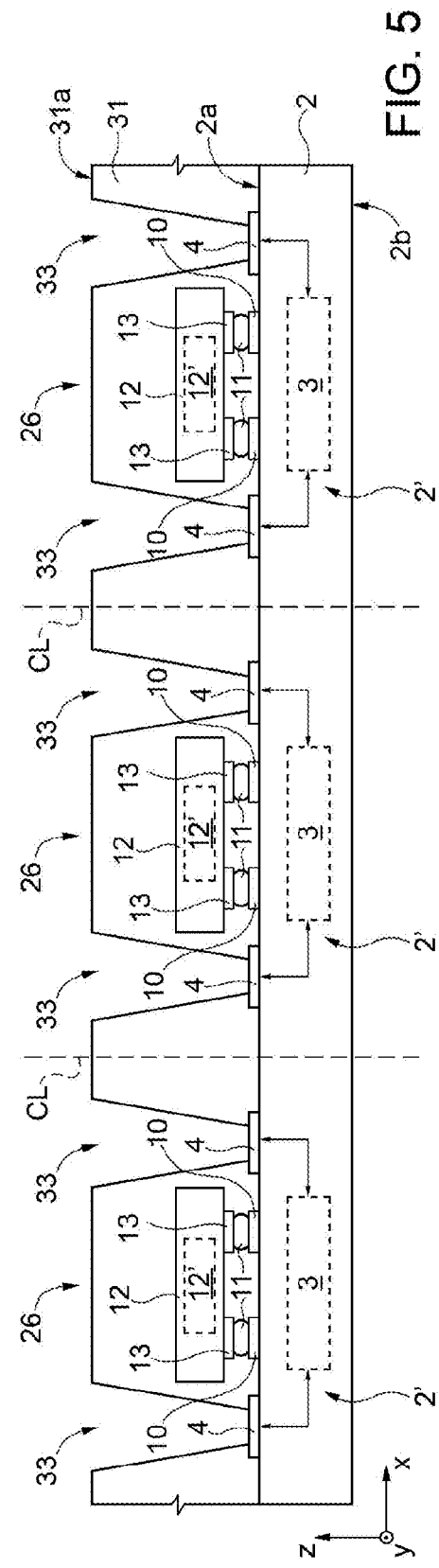

As shown in FIG. 5, the coating 31 is selectively removed starting from the front surface 31a, in regions thereof that extend substantially aligned, in the vertical direction z, to the conductive pads 4. For instance, the step of removal of selective portions of the coating 31 is obtained using a laser, configured for removing selective portions of the coating 31, or else by means of a masked etch, using an appropriate etching chemistry (which, as will be evident to the person skilled in the branch, depends upon the type of resin used).

Removal of selective portions of the coating 31 is carried out throughout the thickness of the coating 31 at the conductive pads 4, until surface portions of the conductive pads 4 are reached and exposed. Trenches or through vias 33 are thus formed, which extend alongside respective MEMS dice 12. In particular, each elementary assembly 26 further includes one or more through vias 33, which extend over the respective conductive pads 4, in the respective portions 2' of the ASIC wafer 2.

Figure 6:
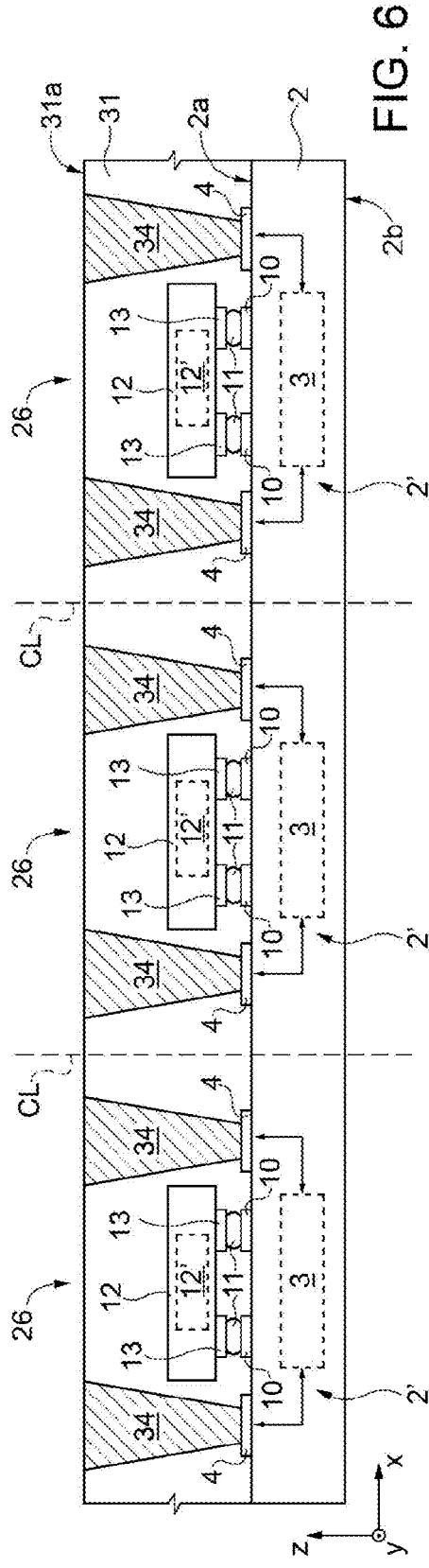

As shown in FIG. 6, the manufacturing method continues with a step of filling of the through vias 33 with conductive material, such as for example a conductive paste, or deposited metal. For instance, it is possible to use a conductive paste with a base of copper and without lead.

According to one embodiment, when the conductive material for filling the through vias 33 is a conductive paste, said conductive paste is spread using a serigraphic technique. According to this embodiment, laid over the coating 31 is a serigraphic mask (not illustrated) including a plurality of openings in areas corresponding to each through via 33. Hence, the through vias 33 are accessible through the openings of the serigraphic mask, whilst the surface of the coating 31 is protected by the serigraphic mask itself. Then, the conductive paste is spread over the serigraphic mask; the conductive paste penetrates through the openings of the serigraphic mask within the through vias 33, and the process proceeds until the through vias 33 are filled. The serigraphic mask is then removed.

According to a different embodiment, the through vias 33 are filled using a conductive fluid-ejection device (based upon inkjet technology) for depositing conductive material selectively in the through vias 33.

Other depositing techniques are possible, for example the sputtering technique, or electrochemical deposition of copper (via plating and filling). In the latter case, a preparation of the walls of the through vias 33 is required to favor deposition of the copper.

Irrespective of the method used for filling the through vias 33, trenches or conductive through vias 34 are formed, which form respective conductive paths through the coating 31 until respective conductive pads 4 are electrically contacted.

Figure 7:
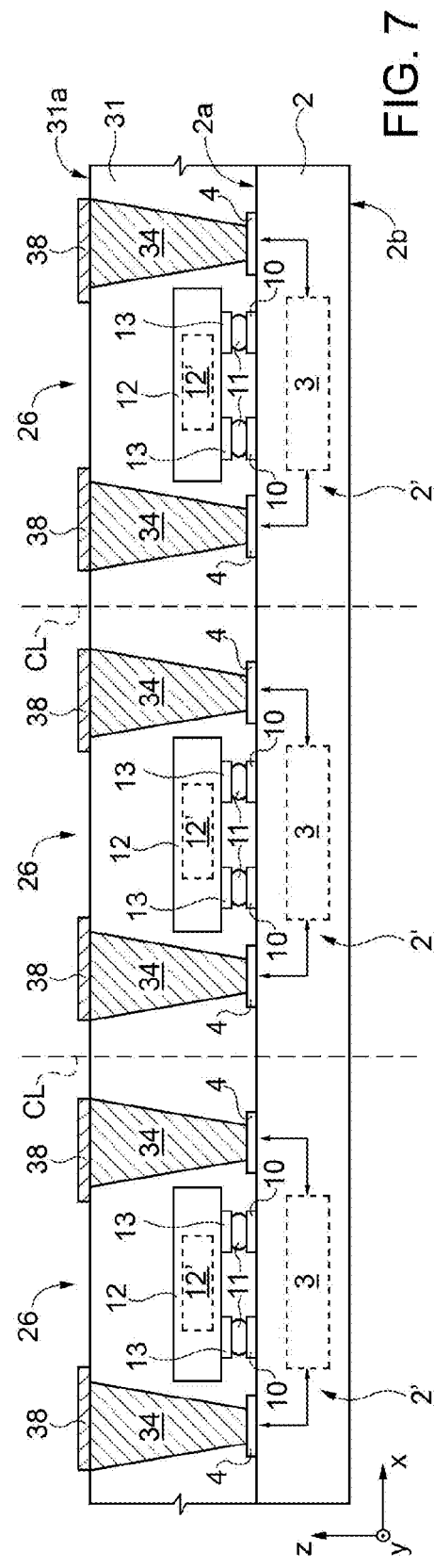

As shown in FIG. 7, a plurality of conductive paths and/or conductive pads (designated as a whole by the reference number 38) are formed on the front surface 31a of the coating 31. Each conductive path/pad 38 is electrically coupled to a respective conductive through via 34 and is electrically insulated from the other conductive paths/pads (for example by means of a dielectric layer, not illustrated).

According to one embodiment, the conductive paths/pads 38 are formed using the serigraphic technique, as described with reference to FIG. 6 for filling the through vias 33. A further serigraphic mask (not illustrated) is deposited on the front surface 31a of the coating 31. The serigraphic mask includes a plurality of openings designed to define the shape and extent of the paths or pads 38 that are to be formed on the coating 31. The thickness of the serigraphic mask defines the thickness of said paths or pads 38. Then, a conductive paste is spread over the serigraphic mask; the conductive paste penetrates through the openings of the serigraphic mask, depositing on the front surface 31a of the coating 31. At the end of this step, the serigraphic mask is removed.

According to an alternative embodiment, the conductive paths/pads 38 can be formed using a device based upon inkjet technology, depositing selectively (without the aid of masks) conductive material on the front surface 31a of the coating 31.

In particular, irrespective of the method used, the conductive paths/pads 38 are formed in electrical contact with the conductive through vias 34 and are electrically insulated from one another.

As shown in FIG. 8, the ASIC wafer 2 is cut. For this purpose, according to one embodiment, the rear surface 2b of the ASIC wafer 2 is set in contact with an adhesive tape or film (the so-called "stick foil"), and then a sawing operation is carried out using a purposely designed cutting tool, such as for example a diamond saw, along the scribe lines CL ideally set between adjacent elementary assemblies 26. In this way, the elementary assemblies 26 are physically separated from one another to obtain a plurality of chips 40. After cutting, the stick foil is removed. Each chip 40, in addition to including the elements that form the respective elementary assembly 26, also includes a portion of the coating 31 that englobes and protects the elementary assembly 26, one or more respective conductive through vias 34, and one or more respective conductive paths/pads 38.

As an alternative to what has been described with reference to FIGS. 4-8, FIGS. 9-13 show manufacturing steps for packaging a MEMS device on an ASIC wafer according to a further embodiment of the present disclosure.

According to this embodiment, after the manufacturing steps described with reference to FIGS. 1, 2A and 2B, the next step (FIG. 9) is a step of cutting of the ASIC wafer 2 along the scribe lines CL, separating from one another a plurality of elementary assemblies 26. It should here be noted that the steps of FIGS. 9-12 refer to the embodiment of FIG. 2B. However, it is evident that the method may be easily applied also to the embodiment of FIG. 3 in a way that is evident for the person skilled in the branch.

Prior to the cutting step of FIG. 9, a deformable stick foil 29 is coupled to the rear surface 2b of the ASIC wafer 2. The cutting step of FIG. 9 brings about complete cutting of the ASIC wafer 2 throughout its thickness at the scribe lines CL, but does not cut into, or only partially cuts into, the stick foil 29.

To enable further manufacturing steps, the stick foil 29 is stretched over the plane xy in both the directions x and y, so as to deform it and in particular so as to separate the elementary assemblies 26 from one another by a certain distance d.

According to a different embodiment, after the step of cutting the ASIC wafer 2, the elementary assemblies are picked up and set alongside one another in the horizontal plane xy, on an adhesive film or tape, e.g., a DAF (die-attach film), separated from one another by the distance d.

Irrespective of the embodiment, the stick foil 29 has the function of keeping the elementary assemblies 26 in a pre-set and fixed position during the subsequent manufacturing steps. In particular, two elementary assemblies 26, adjacent to one another, are separated from one another, in the directions x and y, by a separation distance d that is approximately 50 μm; alternatively, a different separation distance in the directions x and y may be envisaged.

As an alternative to what has been described, the elementary assemblies 26 may be coupled, instead of to the stick foil 29, to a generic resting substrate.

As shown in FIG. 10 a coating 41 similar to the coating 31 is formed, and formed with the same method described with reference to FIG. 4. The coating 41 extends over, and between, each of the elementary assemblies 26. In particular, since, as has been said, the elementary assemblies 26 are separated from one another by a distance d, the coating 41 extends also in said separation spaces, until the stick foil 29 is reached.

The steps of FIGS. 11 and 12 correspond substantially to the steps of FIGS. 5-7, with formation of trenches or through vias 43, which extend throughout the thickness of the coating 41, in areas corresponding to the conductive pads 4, until the conductive pads 4 are exposed and said through vias 43 are filled by conductive material to form conductive through vias 44. Moreover, conductive paths and/or pads 48 are formed on the coating 41, similar to the conductive paths/pads 38 described previously.

As shown in FIG. 13, each elementary assembly 26, provided with a respective portion of the coating 41, of respective conductive through vias 44, and of respective conductive paths/pads 48 is separated from the other elementary assemblies 26 with a cutting step. The scribe lines extend in the spaces of separation between the elementary assemblies 26, which have been filled with the resin of the coating 41. In this way, after the cutting operation, the coating 41 covers and protects completely each elementary assembly 26 also laterally, in the planes yz and xz, as well as at the top (in the plane xy). The stick foil 29 (or the supporting substrate, according to the respective embodiments) is removed before or after the cutting step, indifferently.

A plurality of chips 49 is thus formed, each of which includes an elementary assembly 26 and a portion of the coating 41 protecting the elementary assembly 26.

According to an embodiment of the present disclosure, it is possible to manufacture a complex system of the SiP type that integrates the elementary assembly 26, provided with the coating 31 or 41, with one or more further integrated circuits or specific devices manufactured with surface-mount technology (SMT), known as "surface-mount devices" or SMDs.

Devices produced according to the SMT specifications offer various advantages, amongst which: a considerable reduction of the dimensions of the components and hence smaller dimensions of the apparatuses or systems that include them; possibility of automating and speeding up the assembly procedures; and maximum reduction of rejects, since there is no need to cut the portions of terminals in excess.

FIG. 14 shows the ASIC wafer 2 carrying a plurality of MEMS dice 12 following upon the processing steps described with reference to FIGS. 1-5. What is described here applies in a similar way, that will be evident for the person skilled in the branch, also starting from a structure provided according to the steps of FIGS. 9-12.

Hence, with reference to FIG. 14, one or more dice 50, referred to in what follows as "integrated-circuit (IC) dice", are mechanically coupled to the front surface 31a of the coating 31, where each IC die 50 is at least partially aligned, in the vertical direction z, to a respective MEMS die 12. The IC die 50 is a generic die including an integrated circuit or an SMD, indifferently. It is evident that, according to a different embodiment, each IC die 50 may not be aligned along z to a respective MEMS die, but they may be set staggered with respect to one another in the direction z.

According to a further embodiment, the dice 50 are dice housing a MEMS structure, as described with reference to the MEMS die 12.

According to a further embodiment, some dice 50 house a MEMS structure, whereas other dice 50 house an integrated circuit.

In what follows, reference is made to dice 50 housing an integrated circuit, designated by the reference number 50', without this implying any loss of generality.

In particular, each IC die 50 is provided with electrical-contact pads 50" to enable issuing and reception of electrical control signals to/from the integrated circuit 50''', useful for operation of the integrated circuit 50' itself.

The mechanical coupling between the IC die 50 and the coating 31 is obtained by formation of an adhesive layer 53, for example formed by a layer of glue, which may be conductive or non-conductive, according to the need.

The IC dice 50 may be set alongside the conductive paths/pads 38 or over one or more of them. In this latter case, using a conductive glue as interface between the die 50 and the conductive paths/pads 38, it is possible to make a mechanical and electrical coupling between respective regions of the die 50 and the conductive paths/pads 38 on which the die 50 is set.

In any case, it is evident that the regions that extend along the scribe lines CL are not designed to house any IC die 50.

With reference to FIG. 15, a step of formation of a further protective coating 51, the so-called "mold compound", is carried out, formed directly over the coating 31 and the IC dice 50, which has the function of providing coating, mechanical protection, and electrical insulation, as described with reference to the coating 31. In particular, the coating 51 is made of the same material used for the coating 31, and is formed using the same process steps. The coating 51 likewise covers the conductive paths/pads 38.

As shown in FIG. 16, the steps of selective removal of the coating 51 are carried out to form holes for electrical access to the conductive paths/pads 38 and to the electrical-contact pads 50" of each IC die 50.

For this purpose, a step removing selective portions of the coating 51 is carried out in portions of the conductive paths/pads 38 and in the areas of the electrical-contact pads 50" of each IC die 50. There is thus formed a plurality of trenches or through vias 52, which extend throughout the thickness of the coating 51 until surface portions of the conductive paths/pads 38 are exposed, as well as further trenches or through vias 54 that reach, and expose, surface portions of the electrical-contact pads 50" of the IC dice 50.

The step of removal of selective portions of the coating 51 is performed in a way similar to what has been described with reference to the step of formation of the through vias 33, i.e., using laser or chemical etching.

A step illustrated in FIG. 17 comprises filling with conductive material, for example metal material, or a generic conductive paste, the through vias 52 and the through vias 54. Said step is carried out in a way similar to what has been described with reference to FIGS. 6 and 7, for example using the serigraphic technique or a conductive-fluid ejection (inkjet) device.

Electrical connections with the conductive paths/pads 38 and with the electrical-contact pads 50" are thus formed, which extend substantially as far as the front surface 51a of the coating 51.

This is followed by formation of a plurality of conductive paths and/or pads electrically insulated from one another, which extend over the front surface 51a of the coating 51 (as described with reference to FIG. 7, using the serigraphic technique or by ejection of conductive fluid).

In particular, conductive paths/pads 58a are formed electrically coupled to a respective conductive trench 56, and conductive paths/pads 58b are formed electrically coupled to a respective conductive trench 57.

It is thus possible to gain electrical access, from outside and independently, both to the contact pads 50" of the IC die 50 and to the conductive pads 4, which extend in an over the front surface of the ASIC wafer 2. In particular, the conductive pads 4 are electrically accessible from outside through the conductive paths/pads 58a, the conductive vias 56, the conductive paths/pads 38, and the conductive vias 34.

The ensemble formed by an ASIC 3, a MEMS die 12, an IC die 50, one or more conductive pads 4, one or more respective conductive through vias 34, one or more conductive paths/pads 38, one or more conductive trenches 56, one or more conductive trenches 58, and respective one or more conductive paths/pads 58a and 58b provide an elementary assembly 60.

Figure 18:
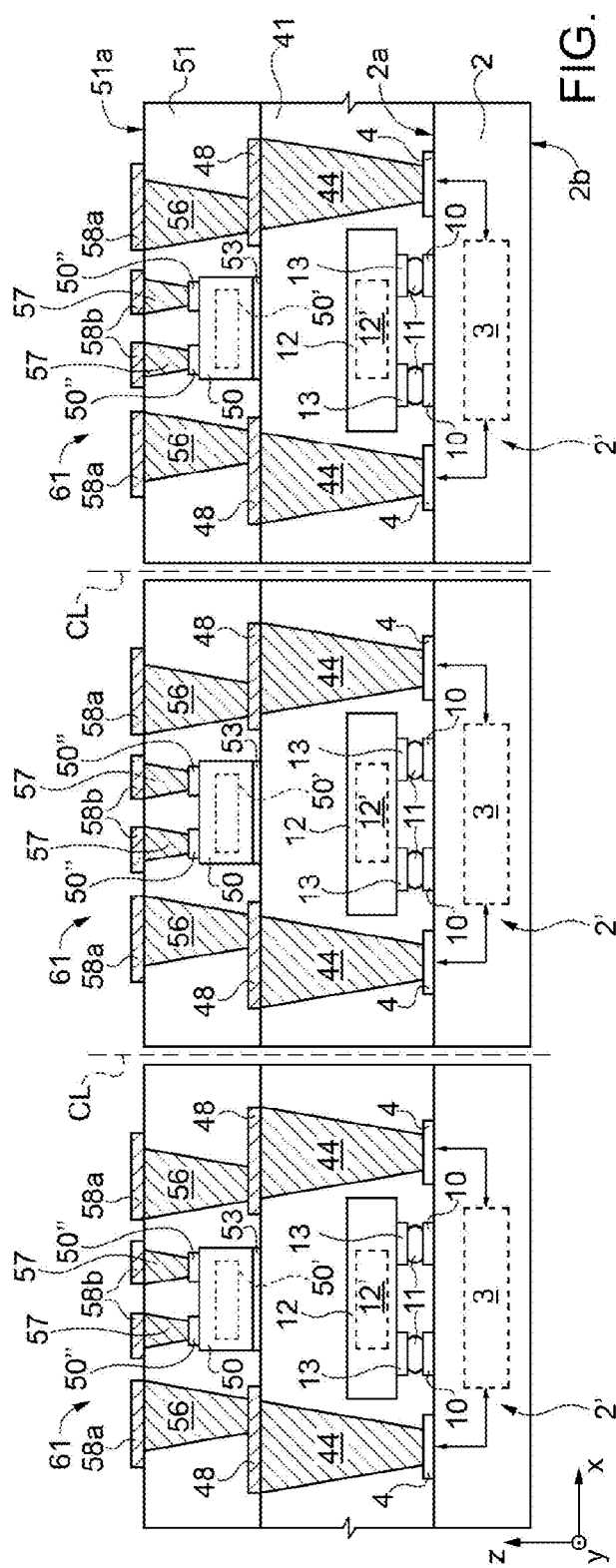

As shown in FIG. 18, there follows a step of cutting the ASIC wafer 2 together with the coatings 51 and 31. For this purpose, according to one embodiment, the rear surface 2b of the ASIC wafer 2 is set in contact with an adhesive tape or film (the so-called "stick foil") (not illustrated), and a sawing operation is carried out using a purposely designed cutting tool, such as for example a diamond saw, along scribe lines CL, which extend between adjacent elementary assemblies 60. In this way, the elementary assemblies 60 are physically separated from one another to obtain a plurality of chips 61. After cutting, the stick foil is removed. Each chip 61, in addition to including the elements that form the respective elementary assembly 60, also includes a portion of the coating 31 (or 41, according to the embodiment) and of the coating 51 that englobes and protects the MEMS die 12 and the IC die 50, respectively.

The advantages of the wafer-level packaging for integrated devices and of the corresponding manufacturing method emerge clearly from the foregoing description.

In general, it is emphasized that the assembly described enables a complete system to be produced, provided with multiple functions, within a single package (the so-called SiP).

In particular, the use of the ASIC wafer 2 as base of the resulting packaging for the electrical connection towards the outside prevents the need to use basic substrates and further intermediate connection structures.

Moreover advantageous is the use of a plurality of coatings 31 and 51, which extend on top of one another, and each of which englobes, protecting it, one or more respective MEMS devices 12 and/or electronic devices 50. Said MEMS devices 12 and electronic devices 50 are accessible from outside through the plurality of trenches and conductive through vias provided through the coatings 31 (or 41) and 51. There is hence no need to form conductive through vias through the ASIC wafer 2, in order to create electrical accesses to the ASIC 3 on the rear surface 2b of the ASIC wafer 2.

In particular, in addition to simplifying and rendering more productive the manufacturing method, it is thus possible to reduce the problems linked to mismatches in the coefficients of thermal expansion of the materials present in the prior art and hence increase the electrical performance of the resulting integrated devices.

The above characteristics hence render the assembly described particularly suited for portable applications.

Figure 19:
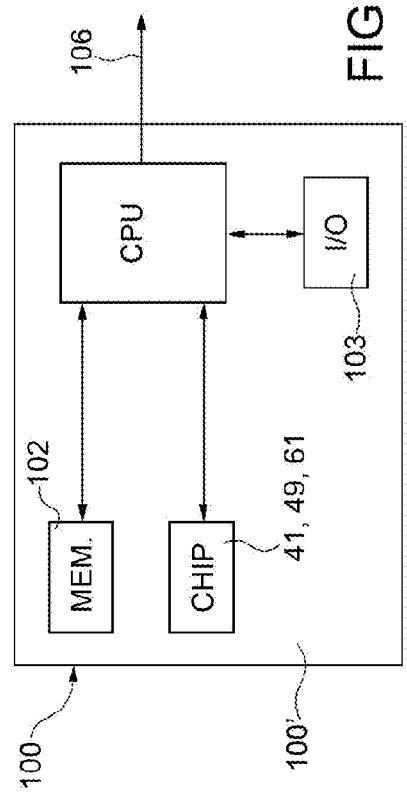
FIG. 19 shows, by means of a block diagram, an electronic apparatus that includes one or more packaged structures manufactured according to any one of the embodiments represented in FIGS. 1-8, or FIGS. 9-13, or FIGS. 14-18.

In this regard, FIG. 19 shows, by means of a block diagram, an electronic apparatus 100 that includes a chip 40, or a chip 49, or a chip 61, according to the respective embodiments of FIGS. 8, 13, and 18. The portable apparatus 100 is, for example, a mobile communication device, such as a cellphone, a smartphone, a PDA, a tablet, a notebook, but also a voice recorder, an audio-file player with voice-recording capacity, a console for videogames, a photographic camera or video camera, said apparatus being generally able to process, store, transmit, and receive signals and information.

The electronic apparatus 100 comprises, in addition to the chip 40 or 61, a microprocessor (CPU) 101, a memory block 102, connected to the microprocessor 101, and an input/output interface 103, for example a keyboard and/or a display, which is also connected with the microprocessor 101.

The chip 40, 49, 61 communicates with the microprocessor 101, and in particular transmits the electrical signals processed by the ASIC 3 associated to the chip 40, 49, 61.

Moreover present is an output stage 106, for generating an signal at output from the electronic apparatus 100, possibly as a function of the electrical signals coming from the chip 40, 49, 61.

As illustrated schematically, the electronic apparatus 100 has a printed circuit board (PCB) 100', electrically coupled to which are the elements of the electronic apparatus 100 itself and the chips 40, 49, 61, by way of the conductive paths/pads 38 of FIGS. 8 and 13 (chips 40 and 49) or of the conductive paths/pads 58a and 58b of FIG. 18 (chip 61).

Finally, it is clear that modifications and variations may be made to what has been described and illustrated herein, without thereby departing from the sphere of protection of the present disclosure.

In particular, it is possible to set, over the coating 51, one or more further dice (not illustrated in the figures) housing a MEMS device and/or an electronic circuit, and cover said further die or dice with a further coating layer, substantially repeating the process steps described with reference to FIGS. 14-18. By replicating the process a number of times chosen according to the need, it is possible to produce stacked structures including any number of MEMS devices and/or an electronic circuit that are substantially aligned in the vertical direction z, each of which is protected by a respective resin coating electrically accessible by means of respective trenches or conductive vias.

Moreover, it is possible, prior to the cutting steps of FIG. 8, or the step of FIG. 9, or the step of FIG. 18, to laser-etch the rear surface 2a of the ASIC wafer 2 around each elementary assembly 26 to provide markers designed to identify uniquely each chip 40, 49, 61 that is obtained at the end of the respective manufacturing steps.

Moreover, the packaging described, and the corresponding manufacturing method, can find application whatever the micromechanical structure integrated in the MEMS die 12 (for example, for each MEMS detection structure) and whatever the integrated circuit of the die 50.

Moreover, the solution described can find advantageous application also in the case where the chip 40 or the chip 61 includes a greater number of dice or bodies of semiconductor material, for packaging the stack in a vertical direction along z, with reduced occupation of space. In particular, embedded in the resin of the coating 31 or 41 or 51, there may possibly be present the MEMS die 12 and further dice integrating further microelectromechanical structures and/or electronic components, once again exploiting, for the electrical connections, conductive through vias, which extend through the respective coating 31, 41 or 51.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A package comprising:
   a first semiconductor body integrating a first microelectromechanical structure;
   a second semiconductor body having a first side that includes:
      an active region integrating an electronic circuit that is coupled to the first microelectromechanical structure; and
      a first electrical-contact region operatively coupled to said electronic circuit;
   a first coating layer of resin located over the first semiconductor body and the second semiconductor body and having a first surface;
   a first conductive through via extending through the first coating layer and electrically coupled to the first electrical-contact region;
   a second electrical-contact region located on the first surface of the first coating layer and electrically coupled to the first conductive through via;
   a third semiconductor body integrating a second microelectromechanical structure;
   a second coating layer of resin located between the second semiconductor body and the first coating layer and surrounding the third semiconductor body and the first electrical-contact region;
   a second conductive through via that extends through the second coating layer and is electrically coupled to the first electrical-contact region; and
   a third electrical-contact region located between the first coating layer and the second coating layer and is electrically coupled to the first conductive through via and to the second conductive through via.

2. The package according to claim 1, wherein the first semiconductor body includes a first electrical-contact pad operatively coupled to the first microelectromechanical structure,
   said packaging further comprising:
      a third conductive through via that extends through the first coating layer and is electrically coupled to the first electrical-contact pad; and
      a fourth electrical-contact region located on the first surface of the first coating layer and is electrically coupled to the third conductive through via.

3. The package according to claim 1, wherein the first semiconductor body is coupled to the second coating layer by an adhesive layer.

4. The package according to claim 1, wherein the second semiconductor body includes a fourth electrical-contact region that is on the first side,
   said packaging further comprising:
      a third conductive through via that extends through the second coating layer and is electrically coupled to the second electrical-contact region; and
      a first electrical-contact pad that is located between the first and second coating layers and is electrically coupled to the third conductive through via, wherein the first semiconductor body includes an active surface housing at least a second electrical-contact pad, said second electrical-contact pad of the first semiconductor body being electrically coupled to the first electrical-contact pad by a conductive wire.

5. The package according to claim 1, wherein the second semiconductor body includes a second electrical-contact region located on the first side, said packaging further comprising:
   a third conductive through via that extends through the second coating layer and is electrically coupled to the second electrical-contact region;
   a first electrical-contact pad located between the first and second coating layers and is electrically coupled to the third conductive through via; and
   a solder ball, wherein the first semiconductor body includes an active surface housing a second electrical-contact pad, said second electrical-contact pad of the first semiconductor body being electrically coupled to the first electrical-contact pad by the solder ball.

6. The package according to claim 1, wherein said third semiconductor body is surrounded by said second coating layer and in direct contact with said second coating layer.

7. The package according to claim 1, wherein said first semiconductor body has side surfaces that are covered by said first coating layer and in direct contact with said first coating layer.

8. A package comprising:
a first semiconductor body integrating a first microelectromechanical structure;
a second semiconductor body having a first side that includes:
an active region integrating an electronic circuit that is coupled to the first microelectromechanical structure; and
a first electrical-contact region operatively coupled to said electronic circuit;
a first coating layer of resin located over the first semiconductor body and the second semiconductor body and having a first surface;
a first conductive through via extending through the first coating layer and electrically coupled to the first electrical-contact region;
a second electrical-contact region located on the first surface of the first coating layer and electrically coupled to the first conductive through via;
a solder ball; and
a third semiconductor body that includes an active surface housing a first electrical-contact pad, said second semiconductor body housing a second electrical-contact pad, said third semiconductor body being electrically coupled to said second semiconductor body in a flip-chip configuration with the solder ball arranged between the first and the second electrical-contact pads.

9. The package according to claim 8, wherein the second semiconductor body further includes a redistribution layer that extends over the first side of the second semiconductor body, said redistribution layer forming an electrical-connection path between the first electrical-contact region and said second electrical-contact pad of the second semiconductor body.

10. The package according to claim 8, wherein said first semiconductor body has side surfaces that are covered by said first coating layer and in direct contact with said first coating layer.

11. A package comprising:
a first semiconductor body integrating a first microelectromechanical structure;
a second semiconductor body having a first side that includes:
an active region integrating an electronic circuit that is coupled to the first microelectromechanical structure; and
a first electrical-contact region operatively coupled to said electronic circuit;
a first coating layer of resin located over the first semiconductor body and the second semiconductor body and having a first surface;
a first conductive through via extending through the first coating layer and electrically coupled to the first electrical-contact region;
a second electrical-contact region located on the first surface of the first coating layer and electrically coupled to the first conductive through via;
bonding wire; and
a third semiconductor body that includes an active surface housing a first electrical-contact pad, wherein said second semiconductor body houses a second electrical-contact pad,
wherein said third semiconductor body is electrically coupled to said second semiconductor body by the bonding wire, wherein the bonding wire is coupled between the first and second electrical-contact pads.

12. The package according to claim 11, wherein the second semiconductor body further includes a redistribution layer that extends over the first side of the second semiconductor body, said redistribution layer forming an electrical-connection path between the first electrical-contact region and said second electrical-contact pad of the second semiconductor body.

13. An electronic apparatus comprising:
a printed circuit; and
a package that includes:
a first semiconductor body integrating a first microelectromechanical structure;
a second semiconductor body having a first surface that includes:
an active region integrating an electronic circuit; and
a first electrical-contact region that is electrically coupled to said electronic circuit;
a molding compound located over the first semiconductor body and the second semiconductor body and having a first surface, the molding compound being in direct contact with the first semiconductor body;
a first conductive through via extending through the molding compound and coupled to the first electrical-contact region; and
a second electrical-contact region located on the first surface of the molding compound and coupled to the first conductive through via, wherein said package is operatively coupled to said printed circuit at the second electrical-contact region;
a solder ball; and
a third semiconductor body that includes an active surface housing a first electrical-contact pad, said second semiconductor body housing a second electrical-contact pad, said third semiconductor body being electrically coupled to said second semiconductor body in a flip-chip configuration with the solder ball arranged between the first and the second electrical-contact pads.

14. The electronic apparatus according to claim 13, wherein the electronic apparatus is at least one of a cellphone, a smartphone, a PDA, a tablet, a notebook, a voice recorder, an audio-file player, a console for videogames, a photographic camera, and a video camera.

15. The electronic apparatus according to claim 13, wherein the molding compound abuts the first surface of the second semiconductor body.

* * * * *